United States Patent [19]

Hayashi et al.

[11] Patent Number: 4,598,242
[45] Date of Patent: Jul. 1, 1986

[54] MASK FEED METHOD AND APPARATUS FOR EXPOSURE REPLICATE SYSTEMS

[75] Inventors: Yutaka Hayashi, Yokohama; Hisao Izawa, Kawasaki, both of Japan

[73] Assignee: Nippon Kogaku K.K., Tokyo, Japan

[21] Appl. No.: 627,449

[22] Filed: Jul. 3, 1984

[30] Foreign Application Priority Data

Jul. 4, 1983 [JP] Japan ................... 58-120409

[51] Int. Cl.⁴ .............................. G05B 1/06
[52] U.S. Cl. ..................... 318/640; 318/577
[58] Field of Search .......... 318/640, 577, 480; 250/201

[56] References Cited

U.S. PATENT DOCUMENTS

| | | | |
|---|---|---|---|
| 4,103,814 | 8/1978 | Nishioka | 318/640 |
| 4,191,916 | 3/1980 | Zaiso et al. | 318/640 |
| 4,203,064 | 5/1980 | Suzuki et al. | 318/640 |
| 4,342,090 | 7/1982 | Caccoma et al. | 318/640 X |
| 4,362,385 | 12/1982 | Lobach | 318/640 X |
| 4,425,537 | 1/1984 | Phillips et al. | 318/640 |
| 4,442,388 | 4/1984 | Phillips | 318/640 |
| 4,466,073 | 8/1984 | Boyan et al. | 318/640 X |

Primary Examiner—B. Dobeck
Attorney, Agent, or Firm—Michael N. Meller

[57] ABSTRACT

A mask feed method and apparatus for deeding and setting with a high degree of positional accuracy a circuit pattern printing mask in a proximity exposure replicate system for printing integrated circuit patterns on a semiconductor wafer. Arranged on the same stage but separated from a wafer chuck is a mask station on which a mask is set a position different from the exposure position and fed to a mask holder at the exposure position for mask feeding purposes. The mask station is provided with its own displacing means for aligning purposes.

Thus, the required movements for mask feeding and alignment purposes are effected by a wafer transfer mechanism.

8 Claims, 7 Drawing Figures

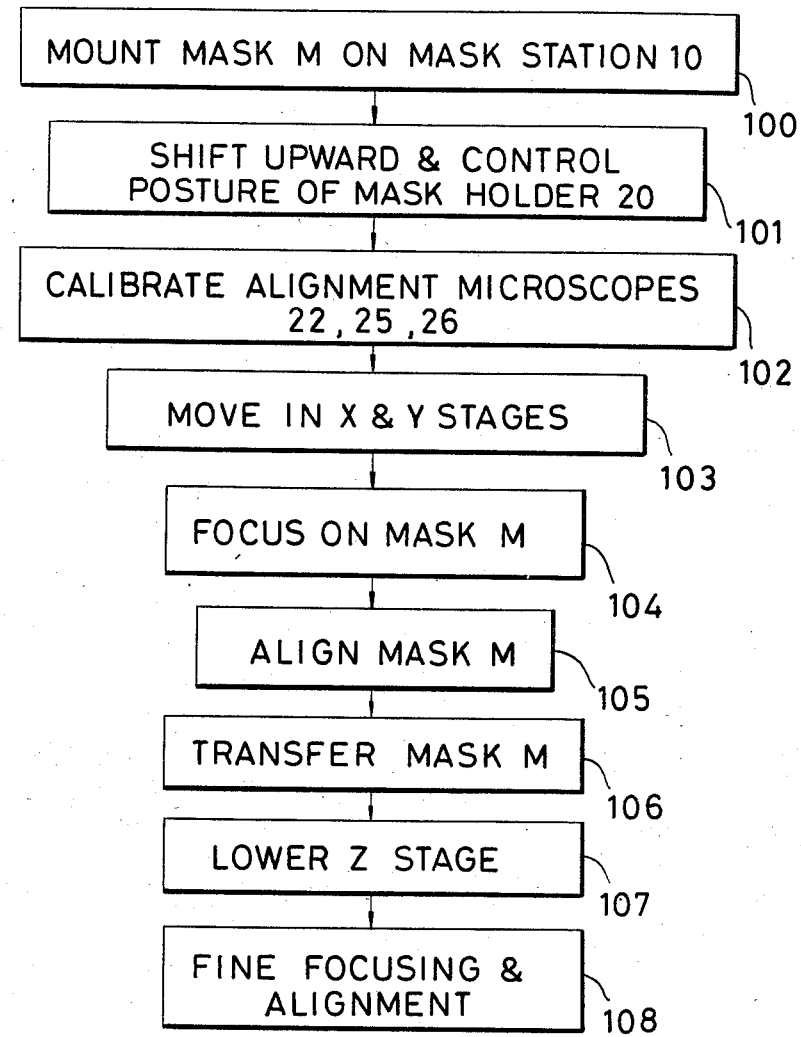
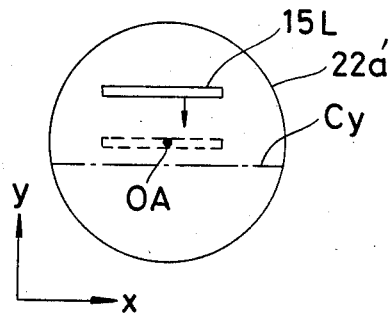
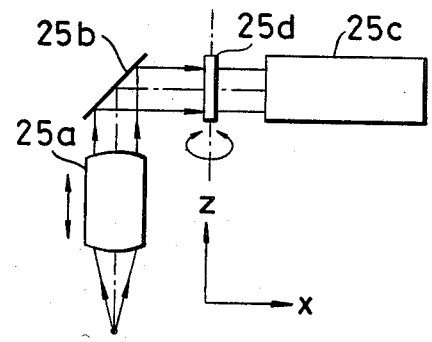

4,598,242

MASK FEED METHOD AND APPARATUS FOR EXPOSURE REPLICATE SYSTEMS

BACKGROUND OF THE INVENTION

The present invention relates to a mask feed method and apparatus for exposure replicate systems and more particularly to a mask feed method and apparatus for feeding and highly accurately setting an integrated circuit pattern printing mask in a proximity exposure replicate system for printing integrated circuit patterns on a semiconductor wafer for the manufacture of a VLSI (very large-scale integrated) circuit.

In a known type of proximity exposure system employing soft X-rays, a mask containing a circuit pattern to be printed is positioned opposite at such a very close distance as 100 μm or less to a semiconductor wafer to be exposed and the exposure is made. As a result, structurally the gap between a mask holder for holding the mask and a wafer stage for carrying the wafer thereon is very small so that the mask must be set in this very small gap and therefore it is not an easy matter to change the masks upon change of the patterns to be printed.

An example of the proposals heretofore made to overcome the foregoing mask changing difficulty is a method disclosed in Japanese Patent Publication No. 56-49449 in which a mask holder is separated from a mask stage at an exposure position and the mask holder having a mask mounted thereon at a position different from the exposure position is moved into the exposure position, thereby effecting the desired alignment and transfer of the mask onto the mask stage. However, this method still involves difficult problems to be solved in that not only an additional mechanism is required for moving the mask holder but also specially a large space for movement is required, the use of these moving parts involves instability factors in the stopping accuracy of the mask during the exposure and so on.

Then, in the case of the proximity exposure system of the step-and-repeat type, the range of movement of the wafer stage is large from the first and therefore it is conceivable to effect the mask movement of the above-mentioned method by means of the wafer stage. In this case, what is to be noted is the fact that generally the traveling speed of the wafer stage must be increased as far as possible so as to increase the processing rate of the exposure replicate system and that the occurrence of any shift in the position of the mask mounted on the wafer stage during its high-speed movement causes an inconvenience during, for example, the transfer operation of the mask. While the mask may be fixedly mounted on the wafer stage by means of the vacuum chucking means for wafer chucking purposes, not only are the mask and the wafer not the same in shape but also the mask must be chucked without allowing anything to come into contact with the inner circuit pattern portion of its back excluding the peripheral portion, in contrast to the wafer which is chucked over all its back side as far as possible so as to improve its surface flatness. Particularly, in the case of a mask for soft X-ray exposure purposes, the X-ray penetrating portions of the pattern are as thin as about 1 to 10 μm and weak and therefore there is the danger of these portions being broken by the vacuum chucking. While this deficiency can be overcome by chucking a mask-carrying jig on the wafer chucking means of the wafer stage, mounting the mask on the jig and moving the mask, each time the mask changing is effected the mask-carrying jig must be mounted and demounted in the proper position and posture with respect to the wafer chucking means and this inevitably causes such deficiencies as deterioration of the operating efficiency and limitation of the processing capacity of the system.

SUMMARY OF THE INVENTION

The present invention has been made in view of the foregoing deficiencies in the prior art and it is the primary object of the invention to provide a mask feed method and apparatus for exposure replicate systems having a simple construction and capable of performing high-speed and high-accuracy mask feeding and changing operations without using any special purpose jig. The method and apparatus are characterized in that a mask station is provided which is separate from a wafer chuck and movable along with a wafer stage as a unit and that a mask is set on the mask station at a position different from an exposure position whereby the mask is moved by the mask station into the exposure position, where the mask is transferred onto a mask holder provided thereat or conversely the mask received from the mask holder is removed from the exposure position to the setting position, thereby making it possible to use the driving system of the wafer stage, as such, for the moving in and out of the masks for mask changing purposes and the mask alignment with respect to the detecting optical axes and also eliminating the need for retreating the mask holder and the exposure optical system during the moving in and out of the masks.

BRIEF DESCRIPTION OF THE DRAWINGS

FIG. 5 is a flowchart showing the sequence of the operation or steps performed by the system of FIG. 4.

FIG. 6 is diagram showing the field of view of the alignment microscope and a positional reference established on the field of view.

FIG. 7 is an optical path diagram showing the construction of the optical system of one of the alignment microscopes.

DESCRIPTION OF THE PREFERRED EMBODIMENTS

A preferred embodiment of the present invention will now be described in detail with reference to the drawings.

Figure 1:
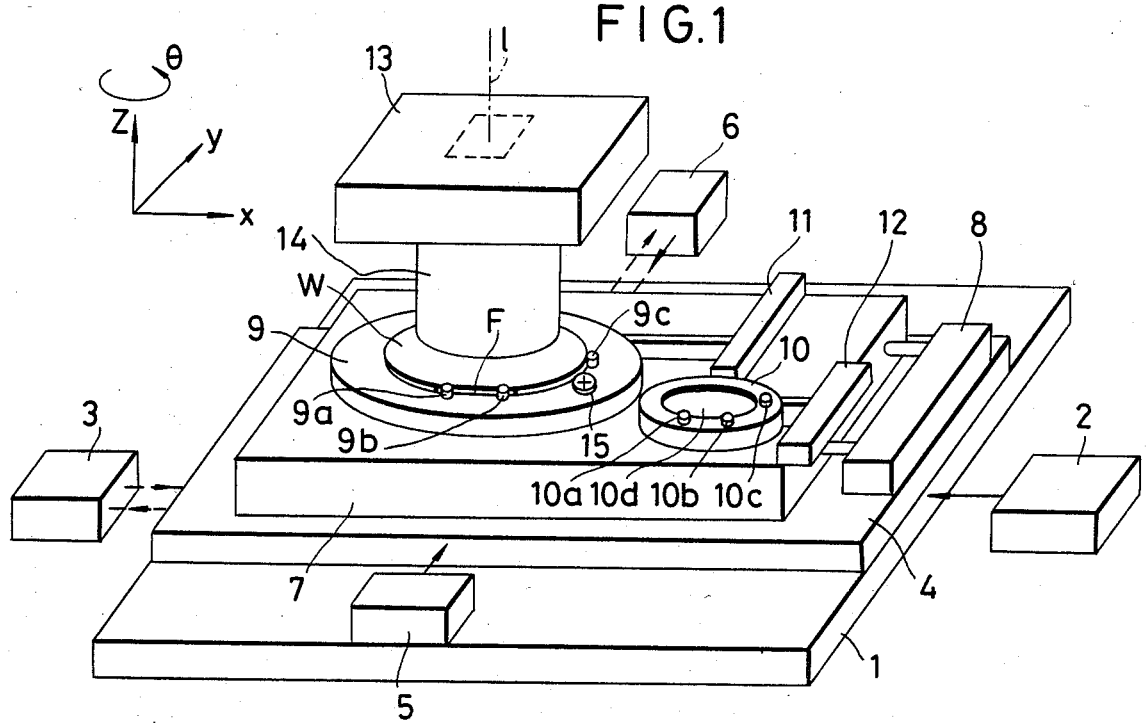
FIG. 1 is a perspective view showing schematically the overall construction of an embodiment of the invention.

Referring to FIG. 1 illustrating a perspective view showing schematically the overall construction of an embodiment of a mask feed apparatus according to the invention, an X stage 1 movable in a direction $x$ is arranged on a fixed base which is not shown and the movement of the X stage 1 is effected by an X actuator 2 comprising a motor or the like. The position of the X stage 1 in the direction $x$ is measured by an X laser interferometer 3. Arranged on the X stage 1 is a Y stage 4 movable in a direction y which is perpendicular to the direction x and the Y stage 4 is driven by a Y actuator 5 similar to the X actuator 2. The position of the Y stage 4 in the direction y is measured by a Y laser interferometer 6. In this way, the X stage 1 and the Y stage 4 form a two-dimensional stage movable within the rectangular coordinate x-y plane, and arranged on the Y stage 4 is a Z stage 7 which is vertically movable in a direction z perpendicular to the x-y plane by a Z actuator 8. Arranged on the Z stage 7 is an object station for mounting thereon an object or a wafer W or a wafer holder 9 and Z stage 7 and the wafer holder 9 from a wafer stage. Also, a mask station 10 for temporarily mounting a mask thereon is arranged on the Z stage 7 at a position different from that of the wafer holder 9. The wafer holder 9 is rotatable by a $\theta$ actuator 11 about its central axis parallel to the z axis with respect to the Z stage 7 and the mask station 10 is also rotatable by another $\theta$ actuator 12 about its axis of rotation parallel to the z axis with respect to the Z stage 7 independently of the wafer holder 9. The wafer holder 9 is formed with locating members (pins, 9a, 9b and 9c) for mounting a wafer W at the desired position and the members 9a and 9b are positioned to contact a flat edge F of the wafer W. Also, the member 9c is positioned to contact the circumferential edge of the wafer W at one place thereof. Also provided on the wafer holder 9 is a fiducial mark 15 for establishing a reference point for alignment purposes or a stage reference position and preferably the mark surface of the fiducial mark 15 is made flush with the mask mounting surface of the mask station 10. Also, the mask station 10 is provided with pins 10a, 10b and 10c which are similar to the locating members 9a, 9b and 9c so that when a mask is placed on the mask mounting surface of the mask station 10, these pins come into contact with the peripheral edge of the mask and serve as references for positioning purposes. The wafer chucking surface of the wafer holder 9 is formed so as to chuck the whole back side of the wafer by vacuum chucking for correcting the flatness of the wafer W. On the other hand, the mask station 10 is formed with a recess 10d in the central portion of its mask mounting surface at a position where the pattern surface of the mask is exactly positioned, so that the mask is chucked at its peripheral portion excluding its exposure area and the recess 10d provides a relief to prevent any contact between the mask station 10 and the mask surface in the exposure area.

In FIG. 1, shown above the stage 7 are an exposure X-ray source 13 fixedly mounted on the fixed base (not shown) and a chamber 14 fixed to the X-ray source 13 so as to direct the X-rays from the X-ray source 13 onto the wafer W on the wafer holder 9. The chamber 14 is filled with helium gas and preferably the gas is caused to flow so as to maintain the chamber pressure slightly positive with respect to the atmospheric pressure.

It is to be noted that although not shown in FIG. 1, arranged at the lower surface of the cylindrical chamber 14 are a mask holder forming mask holding means for receiving the mask from the mask station and holding it at the proper position and a drive unit for the mask holder. Also, arranged around the chamber 14 are detecting means having positional references for detecting the deviations in position between the mask and the wafer and making the alignment, such as, a plurality of alignment microscopes. These elements will be described later with reference to FIG. 2 et seq.

With the overall construction described above, the mask is mounted on the mask station 10 at the setting position and then the stages 1, 4 and 7 are moved in such a manner that the mask station 10 is brought just below the chamber 14 in place of the wafer holder 9 and the mask is transferred onto and aligned on the mask holder on the side of the chamber 14, thus completing the mask feeding or alternatively the empty mask station is brought just below the chamber 14 so that the mask is received from the mask holder and delivered to the setting position, thereby completing the removal of the mask. These mask movements are effected by the two-dimensional movement stage for moving the wafer holder 9. Of course, with the mask fed onto the mask holder, a wafer W is set on the wafer holder 9 and then it is aligned. In this way, the patterns of masks are printed over the entire surface of the wafer W by a so-called step-and-repeat method which repeats the operation of projecting the pattern of a mask onto the wafer by the X-rays and moving the stage a predetermined amount along with the two-dimensional movement of the X and Y stages 1 and 4.

Figure 2:
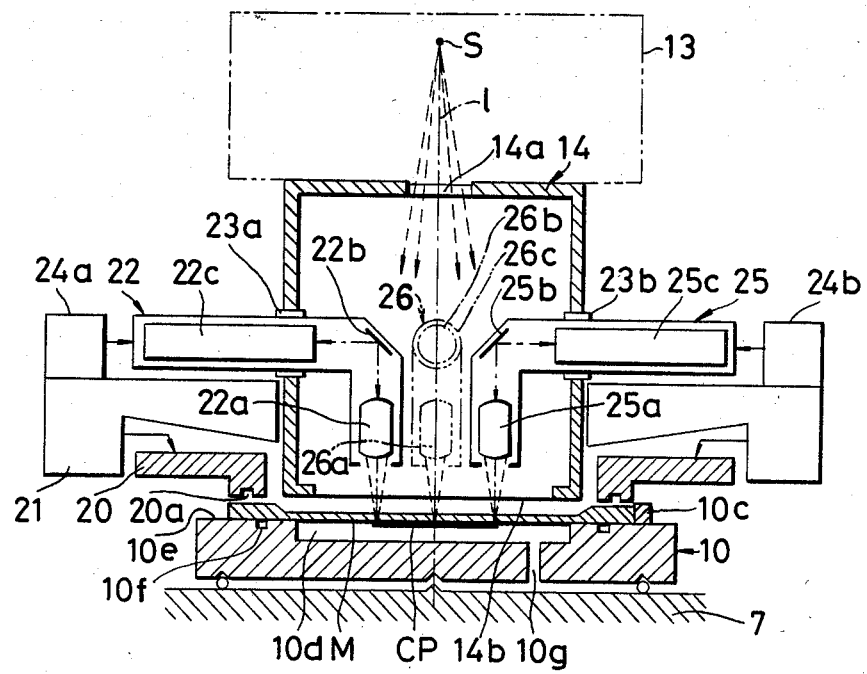
FIG. 2 is a partial longitudinal sectional view showing in detail the construction of the principal part of the embodiment shown in FIG. 1.

FIG. 2 is a partial longitudinal sectional view showing the construction of the alignment system and the mask holder with its drive unit which are arranged around the chamber 14 and the figure shows the mask transfer condition in which a mask M is mounted on the mask station 10 and the stage 7 is moved in the direction x and y, respectively, thereby positioning the mask station 10 just below the chamber 14 in place of the wafer holder 9.

An X-ray penetrating window 14a is formed in the upper surface of the chamber 14 and it separates the high vacuum within the X-ray source 13 and the interior of the chamber 14. Also, a transparent thin film 14b is extended at the lower side of the chamber 14 to penetrate the X rays and it shields the chamber 14 from the atmosphere. The inner pressure of the chamber 14 is made slightly positive with respect to the atmospheric air by the helium gas as mentioned previously and note that in this case the chamber pressure is, of course, in a range which does not ruin the flatness of the thin film 14b.

An annular mask holder 20 is arranged concentrically with the chamber 14 around the lower end thereof and the mask holder 20 is supported so that it is three-dimensionally displaceable along with the X-ray source 13 and the chamber 14, at the lower end portion of the chamber 14 by a three-dimensional drive unit 21 fixedly mounted on the fixed base which is not shown. More specifically, the mask holder 20 is adapted to make various movements including a two-dimensional movement in the x-y plane, a vertical movement in the direction z, a $\theta$ rotation about the axis perpendicular to the x-y plane and a leveling movement by the rotation about the axes in the x and y directions through the three-dimensional drive unit 21.

The mask holder 20 is formed in the lower surface with a vacuum chucking annular groove 20a for chucking the peripheral portion of the mask M excluding the exposure area and holding the mask M in place and the groove 20a is connected to a suction means which is not shown.

On the other hand, the mask station 10, which has been moved just below the chamber 14 in the illustrated condition, also includes a mask vacuum chucking annular groove 10f formed in a mounting surface 10e which contacts with the peripheral portion other than the exposure area of the mask M mounted on the upper surface of the mask station 10. The portion of the mask station 10 corresponding to the mask exposure area is provided a relief by the recess 10d so as to not contact with the mask M and the recess 10d is formed with an air vent hole 10g so as to permit ventilation of the interior of the recess 10d to the outside through the hole 10g and the gap between the mask station 10 and the stage 7 so as to prevent the air within the recess 10d from being confined during the mounting and chucking of the mask M or the releasing of the chucking and dismounting of the mask M and applying any undesired stress to the thin film of the mask M.

Three alignment microscopes 22, 25 and 26 are arranged on the peripheral wall of the chamber 14 so as to move into and out of the chamber 14 and the alignment microscope 22 on the left side of FIG. 2 is mounted on the chamber 14 through a sealing member 23a so as to be moved by an actuator 24a such that its objective lens 22a is moved toward and away from an axis $l$ passing through the source S of the X-ray source 13 and perpendicular to the x-y plane through the moving in and out of the alignment microscope 22. Also, the optical axis of the objective lens 22a is maintained parallel to the axis $l$ and the light beam of the observed image, the alignment laser beam or the like passed through the lens 22a is deflected horizontally by a mirror 22b to reach an optical system 22c including an illuminating system and a detecting system. The right alignment microscope 25 is of the same type as the left alignment microscope 22, that is, it is mounted on the chamber 14 through a sealing member 23b to move into and out of the chamber 14 and it is also movable by an actuator 24b so as to cause its objective lens 25a to move toward and away from the axis $l$. The optical axis of the objective lens 25a is also maintained parallel to the axis $l$ and its optical path is deflected horizontally through a mirror 25b to reach an optical system 25c. The central alignment microscope 26 shown by the chain line in FIG. 2 is mounted on the chamber 14 so as to be driven by its actuator to move in and out in a direction perpendicular to the paper plan in the Figure and it is moved such that its objective lens 26a is moved toward and away from the axis $l$. The optical axis of the objective lens 26a is also maintained parallel to the axis $l$ and its optical path is deflected horizontally by a mirror 26b to reach an optical system 26c.

Each of the optical system 22c, 25c and 26d of the alignment microscopes 22, 25 and 26 includes an alignment position detecting function and a focus detecting function.

These alignment microscopes 22, 25 and 26 perform the positioning of the mask M or the wafer W with respect to the system reference positions, the alignment of the mask M and the wafer W relative to each other and the detection of the focusing of the objective lens with respect to the mask M and the wafer W.

Figure 3:
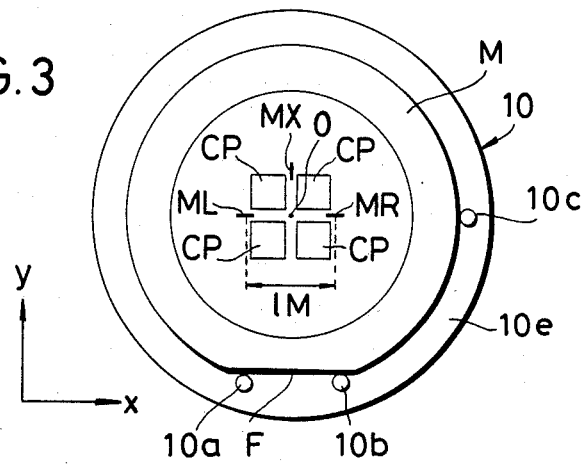
FIG. 3 is a plan view showing in enlarged form the pattern on a mask mounted on the mask station of FIG. 1.

FIG. 3 is a plan view showing the mask M mounted on the mask station 10 and generally the mask M is produced by processing a silicon wafer in disc form. In this example, the mask M is formed with the four identical circuit patterns CP in the directions $x$ and $y$ with respect to its center O and small alignment marks ML and MR extending in the direction $x$ are arranged apart by a given lateral spacing lM on a street line extending in the direction $x$ through the center O. Also, another small alignment mark MX extending in the direction $y$ is formed on the upper part of another street line extending in the direction $y$ through the center O. The mask M is mounted on the mask station 10 by loading means (not shown) at a setting position different from the exposure position just below the chamber 14 in such a manner that the straight cut formed at a portion of the peripheral edge of the mask M or the flat F is brought into contact with the pins 10a and 10b vertically fitted on the mounting surface 10e of the mask station 10 and a part of the peripheral edge of the mask M is brought into contact with another pin 10c. In this case, the straight line direction of the flat F substantially coincides with the direction $x$ and the direction of the segment connecting the marks ML and MR, and the alignment mark ML formed between the patterns on the mask M is used by the alignment microscope 22 for the detection of one position in the direction $y$. The mark MR is used by the alignment microscope 25 for the detection of the other position in the direction $y$ and the mark MX is used by the alignment microscope 26 for the detection of a position in the direction $x$.

Figure 4:
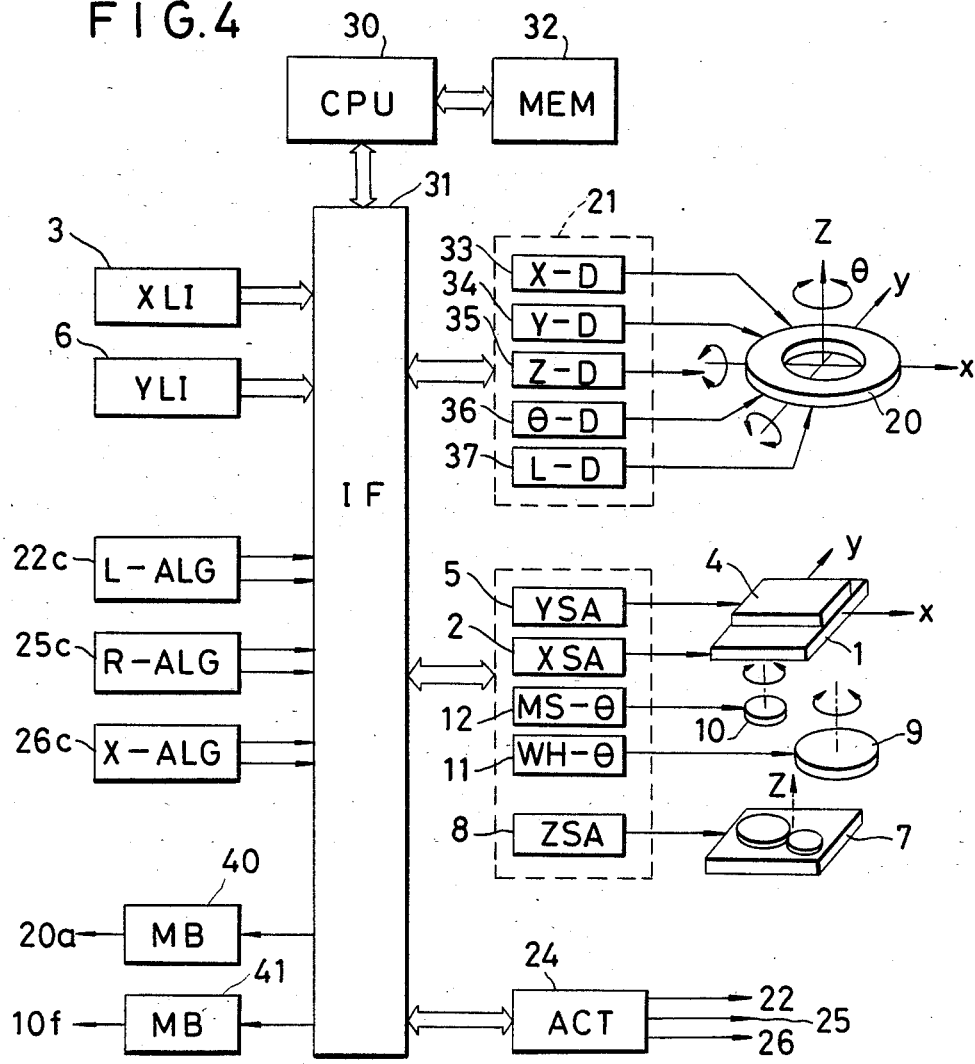
FIG. 4 is a block diagram showing an exemplary overall construction of the alignment control system in the embodiment of FIG. 1.

Now referring to FIG. 4, there is illustrated a block diagram showing the construction of the control system for the whole system of the invention and the control of the whole system is performed by a central processing unit or (CPU) 30. Connected to the (CPU) 30 is a memory or (MEM) 32 storing a program for controlling the apparatus and the memory 32 stores data such as computational results, etc. An interface circuit (IF) 31 performs the transmission of the required information between the CPU 30 and various detecting systems and controlled systems. The position information from the X laser interferometer or (XLI) 3 and the Y laser interferometer or (YLI) 6, which are also shown in FIG. 1, are stored in the memory 32 by the CPU 30 through the interface circuit 31. On the other hand, the optical system (L-ALG) 22c of the alignment microscope 22, the optical system (R-ALG) 25c of the alignment microscope 25 and the optical system (X-ALG) 26c of the alignment microscope 26 respectively detect whether the alignment marks ML, MR and MX on the mask M placed just below the chamber 14 are at the desired positions with respect to the positional references established in the optical systems themselves to generate the required alignment signals and they also respectively detect whether the alignment marks are at the focal positions of the objective lenses 22a, 25a and 26a, respectively, to generate focus signals. These alignment signals and the focus signals are input to the CPU 30 through the interface circuit 31.

In FIG. 4, the actuators shown in FIG. 1 are shown as the actuator (XSA) 2 for the X stage 1, the actuator (YSA) 5 for the Y stage 4, the actuator (ZSA) 8 for the stage 7, the $\theta$ rotation actuator (WH-$\theta$) 11 for the wafer holder 9 and the $\theta$ rotation actuator (MS-$\theta$) 12 for the mask station 10 and the operations of these stage-side actuators are controlled by the position feedback control or the open control loop by the CPU 30 through the interface circuit 31.

On the other hand, the mask holder 20 is moved by the three-dimensional drive unit 21 which includes means (X-D) 33 for causing the mask holder 20 to make a linear motion in the direction $x$, means (Y-D) 34 for causing the holder 20 to make a linear motion in the direction $y$, means (Z-D) 35 for causing the holder 20 to make a linear motion in the direction $z$ perpendicular to the directions $x$ and $y$, means ($\theta$-D) 36 for causing the holder 20 to make $\theta$ rotation about the $z$ axis, and means (L-D) 37 for rotating the mask holder 20 about the x and y axes for the purpose of its leveling.

It is to be noted that the plane formed by the x and y axes of the mask holder 20 is predetermined so as to coincide with the pattern surface of the mask M when the mask M is held on the mask holder 20 and the intersection of the two axes is predetermined so as to coincide with the center O of the mask M with respect to the direction z. As a result, when the mask holder 20 is placed in its neutral condition (a condition in which the holder 20 is held horizontally at the center of its movement in the directions x, y and z), the z axis passing through the intersection of the x and y axes coincides with the previously mentioned axis l.

Then, the actuators 24a, 24b and 24c (shown as ACT 24 in FIG. 4) for moving in and out the alignment microscopes 22, 25 and 26 are also controlled by the CPU 30 through the interface circuit 31 and the alignment 30 through the interface circuit 31 and the alignment microscopes 22, 25 and 26 are moved in and out independently of each other. Also, the amount of movement of each microscope is controlled accurately by the position feedback control.

Also, in FIG. 4, an electromagnetic valve (MB) 40 is turned on and off so as to control the vacuum chucking of the back of the pattern surface of the mask M by the annular grove 20a of the mask holder 20 and another electromagnetic valve (MB) 41 is similarly turned on and off so as to control the vacuum chucking of the peripheral portion of the pattern surface of the mask M by the annular groove 10f of the mask station 10. The on-off operations of these electromagnetic valves are controlled by the CPU 30 through the interface circuit 31.

The operation of the above-described control system will now be described with reference to FIG. 5. FIG. 5 is a flowchart showing the operations performed to complete the transfer of a mask onto the mask holder 20 and the simplified procedure for completing the final alignment of the mask M with respect to the system and the individual processing steps will now be described in due order.

At this step which is the first step, on condition that there is no mask M on the mask holder 20, the positions of the X stage 1 and the Y stage 4 are shifted respectively by the stage actuators (XSA) 2 and (YSA) 5 and the laser interferometers (XLI)3 and (YLI)6 under the control of the CPU 30 such that the mask station 10 is moved to a setting position established at a position other than just below the chamber 14. When the mask station 10 is brought to the setting position, a mask M is mounted on the mask station 10 and in this case the mask M is mounted at the desired position as shown in FIG. 3 by utilizing the pins 10a, 10b and 10c. The loading of the mask M for this purpose may be effected automatically or manually. Then, the CPU 30 turns on the electromagnetic valve 41 so that the mask M is vacuum chucked at its peripheral portion by the groove 10f and a transfer is then made to the next step 101.

Step 101

At this step, the posture of the mask holder 20 is first changed to the neutral position through the operation of the x- and y-direction linear drive means (X-D) 33 and (Y-D)34, the θ drive means (θ-D) 36 and the leveling drive means (L-D) 37 of the three-dimensional drive unit 21 and the mask holder 20 is retreated upward (toward the source 13) in FIG. 2 through the operation of the linear drive means (Z-D) 35. This neutral position represents a condition in which the mask holder 20 is not inclined with respect to the x and y axes at its central position in the range of movement in the directions x and y and the mask holder 20 is maintained horizontally (in the x-y plane). As a result, the axis l coincides with the z axis in this condition. When the retreatment of the mask holder 20 to the neutral position is completed, the CPU 30 proceeds to the next step 102.

Step 102

At this step 102, the alignment microscopes 22, 25 and 26 are each moved forward a desired amount by the actuator unit 24. Regarding this amount of movement, the positional relations of the alignment marks ML, MR and ML on the masks M with respect to the center A have been predetermined and known and therefore the corresponding amount of movement is made. In this way, the alignment microscopes 22, 25 and 26 are positioned so that the alignment marks ML, MR and MX of the mask M are respectively brought into the fields of view of the objective lenses 22a, 25a and 26a. Then, after the wafer holder 9 has been rotated by θ and brought to its neutral position by the θ rotation actuator 11, by the stage actuators (XSA)2 and (YSA)5 and the laser interferometers (XLI) 3 and (YLI)6, the X and Y stages 1 and 4 are moved and positioned so that the fiducial mark (FM) 15 on the wafer holder 9 is observed by the left alignment microscope 22. After this positioning, the focusing on the fiducial mark 15 is effected by the detecting optical system 22c, and also the X and Y stages 1 and 4 and the stage 7 are moved in such a manner that a mark 15L, which is included in the fiducial mark 15 as shown in FIG. 6 and equivalent to the alignment mark ML on the mask M, coincides with the preliminarily established positional reference, e.g., the optical axis OA of the objective lens 22a (or the y-direction center line of view Cy). In FIG. 6, numeral 22a' designates the field of view of the objective lens 22a and the distance between the optical axis OA and the center line Cy has a predetermined value, although the center line Cy need not pass through the optical axis OA. As a result, the amount of deviation of the mark 15L with respect to the center line Cy is generated as an alignment signal from the optical system (L-ALG) 22c and the CPU 30 reads the alignment signal to control, in particular, the movement of the Y stage 4 for alignment purposes. Then, the X stage 1 is moved in the direction x by the distance lM separating the alignment marks ML and MR of the mark M by the actuator 2 and the laser interferometer 3 and the same mark 15L of the fiducial mark 15 is brought into the field of view of the right alignment microscope 25. While not shown in FIG. 3, as shown in FIG. 7, the alignment microscope 25 has a parallel-plate glass 25d inserted in the collimated light beam portion of its optical path and it is rotated about its axis parallel to the axis so as to shift in the direction y within the field of view of the objective lens 25a. In addition, the objective lens 25a is also adapted for fine movements in the direction of its optical axis for such operations as focusing adjustment and the like. After the mark 15L has been brought into the field of view of the objective lens 25a in this way, the focusing and alignment are effected with respect to the mark 15L by the optical system 25c. In this case, the focusing is effected by vertically moving the objective lens 25a and the alignment of the mark 15L is effected in the like manner as shown in FIG. 6, that is, the parallel plate glass 25d is inclined in such a manner that the mark 15L is aligned with the y-direction center line of view Cy established as a positional reference in the alignment microscope 25.

The above-described operations accomplish the calibration of the focus detection and position detection of the left and right alignment microscopes 22 and 25 and their center lines of view Cy coincide with an x-direction straight line and are separated by the distance from each other, thus performing a so-called paralleling.

The similar parallel plate glass and mechanism for causing fine movements of the objective lens 26a in the optical axis are also incorporated in the remaining alignment microscope 26 so that in all the same manner the fiducial mark 15 is positioned just below the objective lens 26a and the desired calibration is made by the optical system 26c. After the calibration has been completed a transfer is made to the next step 103.

Step 103

At this step, in accordance with the measured values of the laser interferometers 3 and 6 the X and Y stages 1 and 4 are moved in such a manner that the mask M on the mask station 10 is positioned just below the mask holder 20. The control of this movement of the stages 1 and 4 can be effected easily in accordance with the positions in the x-y plane of the fiducial mark 15 and the center of the mask station 10, which are preliminarily determined mechanically by storing in the memory 32 the x-direction and y-direction positions of the stages at the time when the fiducial mark 15 was detected by the alignemnt microscopes at the step 102. Also, when the mask station 10 is to be moved into a position just below the chamber 14, the Z stage 7 is lowered by the Z actuator 8. When the move-in of the mask station 10 is completed, a transfer is made to the next step 104.

Step 104

At this step, since the mask M has been positioned just below the thin film 14b of the chamber 14, the focusing on the alignment marks ML and MR of the mask M is respectively effected by the optical systems 22c and 25c of the left and right alignment microscopes 22 and 25. More specificaly, the Z stage 7 is moved upward by the Z actuator 8 and this upward movement is stopped when the focusing is practically effected by the optical system 22c and 25c. This is accomplished by subjecting the actuator 8 to the position feedback control via the CPU 30 in accordance with the focus signals from the optical systems 22c and 25c. Also, in case of need, the focus detection is effected by the optical system 26c of the remaining alignment microscope 26, thereby effecting the focusing on the three alignment marks ML, MB and MR on the average.

In this case, as regards the vertical movement of the Z stage 7, by initially setting mechanically such that the mounting surface 10e of the mask station 10 is flush with the mounting surface of the wafer holder 9 or the mounting surface 10e is higher than the other by the thickness of the wafer W and also the mark surface of the fiducial mark 15 is flush with the mounting surface 10e of the mask station 10, it is possible to eliminate any undesired vertical movement of the Z stage 7 and ensure a reduction in time when the X and Y stages are moved for the focusing with respect to the fiducial mark 15 at the step 103 and the focusing with respect to the alignment marks of the mask M at the step 104.

After the focusing on the alignment marks of the mask M has been completed, a transfer is made to the next step 105.

Step 105

At this step, the alignment marks ML, MR and MX are first aligned with respect to the alignment microscopes 22, 25 and 26. For this purpose, in accordance with the alignment signals from the optical systems 22c and 25 of the alignment microscopes 22 and 25, the y-direction deviations of the marks MR and ML are detected and the desired amount of rotary movement of the mask M is computed by the CPU 30. Then, the mask station 10 is rotated by this desired amount by the rotation actuator 12. When this occurs, the segment connecting the alignment marks ML and MR is made parallel to the segment connecting the center lines of view Cy of the alignment microscopes 22 and 25. Then, the Y stage 4 is moved slightly by the Y actuator 5 so that the center line of view Cy of the alignment microscope 22 is aligned with the mark ML and the center line of vieCy of the alignment microscope 25 is aligned with the mark MR. The alignment mark MX is also aligned in accordance with the alignment signal from the optical system 26c of the remaining alignment microscope 26 and this is accomplished by moving X stage 1 by the X actuator 2 in accordance with the alignment signal from the optical system 26c and thereby aligning the center line of view Cy of the alignment microscope 26 with the alignment mark MX.

It is to be noted that while, in this embodiment, the steps 104 and 105 form separate steps, it is possible to arrange so that the step 104 is performed simultaneously when the alignment marks ML, MR and MX are respectively detected by the respective alignment microscopes at the step 105 and in this case the Z stage 7 is moved vertically by the Z actuator 8. After the completion of the above-mentioned alignment a transfer is made to the next step 106.

Step 106

Then, when the alignment of the mask M with respect to the alignment microscopes 22, 25 and 26 has been completed at the step 105, the CPU 30 turns on the electromagnetic valve 40 and the vacuum chucking of the mask M to the mask holder 20 by the annular groove 20a is started. The mask holder 20 is lowered through the operation of the Z linear drive means (Z-D) 35 and in this case the mask M on the mask station 10 below the mask holder 20 is practically at the focal points of the alignment microscopes. During the lowering of the mask holder 20, the CPU 30 continuously reads the atmospheric pressure signal from a vacuum sensor (not shown) provided for the annular groove 20a so that when the chucking of the mask M by the annular groove 20a is detected by a change in the atmospheric pressure signal, the CPU 30 applies a command to the linear drive means (Z-D) 35 to stop the lowering movement and also the electromagnetic valve 41 is turned off, thereby releasing the chucking of the mask M by the annular groove 10f of the mask station 10.

In this way, the mask M on the mask station 10 is transferred onto the mask holder 20 in its aligned condition.

It is to be noted that the sequence of the operations for the transfer of the mask M may be partially changed as follows. More specifically, the X and Y stages 1 and 4 may, for example, be moved in such a manner that the mask M on the mask station 10 is aligned only with respect to the directions x and y by the alignment microscopes 22, 25 and 26 after the step 102 and the rotational deviation of the mask M is detected by means of the alignment marks ML and MR. Then, the mask holder 20 is preliminarily rotated by the amount corresponding to the rotational deviation by the θ drive means (θ-D) 36 and the rotational deviation correction by the θ rotation actuator (MS-θ) 12 of the mask station 10 is not effected. In this condition, the Z stage 7 is raised and the mask holder 20 is lowered, thereby transferring the mask M from the mask station 10 onto the mask holder 20. Then, the mask holder 20, which has been rotated preliminarily by the rotational deviations, is rotated by the same amounts in the reverse direction and returned to the original position. By using this sequence, it is possible to eliminate the θ rotation actuator (MS-θ)12.

While the transfer of the mask M in the course of its feeding has been effected as described above at the step 106, in this case, however, it is expected that the alignment of the mask M will become inaccurate during the transfer of the mask M from the mask station 10 onto the mask holder 20.

Therefore, in accordance with the present embodiment, the mask M is aligned again on the mask holder 20 at the next step 107 and the following.

Step 107

The completion of the transfer of the mask M from the mask station 10 onto the mask holder 20 is detected in accordance, for example, with the atmospheric pressure signals from the annular grooves 20a and 10f and then the CPU 30 lowers the Z stage 7 by the Z actuator 8 to such a position that the mask station 10 in no way impedes the realignment of the mask M. Then a transfer is made to the next step 108.

Step 108

Since the focal positions of the alignment microscopes have been calibrated to coincide with the moving plane of the X and Y stages 1 and 4 at the step 102, at the step 108 the y-direction focus errors of the alignment marks ML, MR and MX of the mask M are detected in accordance with the focus signals from the alignment optical systems 22c, 25c and 26c. In accordance with the results of the focus error detection the CPU 30 controls the operation of the Z linear drive means (Z-D)35 and the leveling drive means (L-D)37 and the three-demensional posture of the mask M is controlled in such a manner that the plane containing the alignment marks of the GYmask M registers with the focal positions of the objective lens 22a, 25a and 26a of the three alignment microscopes. Then, the deviations of the alignment marks ML and MR from the positional references (Cy) are detected by the left and right alignment optical systems 22c and 25c and the amount of rotational deviation of the mask M is detected, thereby controlling the operation of the θ drive means (θ- D)36 to reduce the amount of rotational deviation to zero. Then, the y linear drive means (Y-D) 34 is operated in accordance with the alignment signals from the optical systems 22c and 25c so as to make tne alignment of the alignment marks ML and MR with respect to the direction y and the desired fine alignment of the mask M with respect to the direction y is made. Similarly, the x linear drive means (X-D)35 is operated in accordance with the alignment signal from the optical system 26c so as to make the alignment of the alignment mark MX in the direction x and the fine alignment of the mask M with respect to the direction x is made.

It is to be noted that if the pattern surface of the mask M is deviated from the focal position during the above-mentioned correction of the rotational deviation of the mask M and alignment with respect to the directions x and y, it is only necessary to again effect the focus detection and effect the focusing by the z linear drive means (Z-D)35 and the leveling drive means (L-D)37.

After the steps 100 to 108 have been completed, the wafer W is mounted on the wafer holder 9 and the X and Y stage 1 and 4 are moved, thereby aligning the mask M and the wafer W with each other by the alignment optical systems 22c, 25c and 26c.

Thus, the pattern of the mask M (the circuit patterns CP) is registered with the patterns already printed on the wafer W, projected and printed thereon by the X-rays from the source S. In this case, it is needless to say that the Z actuator 8 and the z linear drive means (Z-D)35 are operated so that the gap between the mask M and the wafer W assumes a predetermined value.

Then, as regards the sequence of operations for removing the mask M on the mask holder 20 for the replacement of the mask with the mask of the next pattern, there is no need for the fine alignments by the alignment optical systems and therefore it is only necessary for the CPU 30 to perform a series of operations in accordance with a predetermined program, that is, moving the empty mask station 10 into a position just below the mask holder 20, raising the Z stage 7 and lowering the mask holder 20, turning on and off the electromagnetic valves 40 and 41 and transferring the mask from the mask holder 20 onto the mask station 10, lowering the Z stage 7 and raising and retreating the mask holder 20 and returning the mask station 10 to the setting position thereby removing the mask.

While, in the above-described embodiment, during the move-in, move-out and transfer of the mask M the mask station 10 is moved in the direction z by raising the Z stage 7, this is only for the purpose of showing an example of the common use of the vertical driving system of the wafer holder 9 and it is also possible to arrange so that the mask station 10 is moved independently of the Z stage 7.

Further, the coarse alignment of the mask M on the mask station 10 during its move-in and transfer operation is not limited to the method of the above-described embodiment which utilizes the alignment microscopes and it may be performed by any other position detecting means. For example, it is possible to arrange the desired registration marks (e.g. pin holes or small depressions by etching) on the mask M in addition to the alignment marks ML, MR and MX and also arrange photoelectric sensors such as reflection-type photo couplers on the mask holder 20 in correspondence to the positions of the registration marks whereby when the X and Y stages 1 and 4 are moved, thus positioning the mask M on the mask station 10 just below the mask holder 20 having the photoelectric sensors, the X and Y stages 1 and 4 are moved and positioned in place in accordance with the output signals of the photoelectric sensors. By so doing, it is possible to rapidly perform the coarse alignment of the mask M as compared with the case employing the alignment microscopes and it is also possible to reduce the time required up to the transfer of the mask M onto the mask holder 20. In this case, the accuracy of this coarse alignment must, of course, be made to come within the range of the following fine adjustment by the thre-dimensional movement of the mask holder 20 by the alignment microscopes.

Further, if the mask M can be positioned and mounted on the mask station 10 with a high degree of reproducibility by means of the pins 10a, 10b and 10c, it is possible to arrange special purpose marks on the mask station 10 and use them in place of the alignment marks ML, MR and MX of the mask M for the purpose of making the alignment for the transfer of the mask M onto the mask holder 20. In this case, it is also possible to detect the special purpose marks on the mask station 10 by the alignment microscopes 22, 25 and 26 which are essentially intended for making the mask and wafer alignment or the special purpose marks may be detected by special purpose photoelectric sensors. Where the alignment microscopes are used, after the completion of the step 102 in FIG. 5, the X and Y stages 1 and 4 are moved so that the special purpose marks (preferably a plurality of the marks) on the mask station 10 are detected by the alignment microscopes and the positions of the X and Y stages 1 and 4 at the time of the detection are measured and stored in the memory 32 through the laser interferometers 3 and 6 whereby in accordance with the stored values, the CPU 30 computes the amounts of deviation in the directions $x$ and $y$ of the mask M with respect to the centers of view (Cy) of the alignment microscopes 22, 25 and 26 and again moves the X and Y stages 1 and 4 by the computed amounts of deviation.

What is claimed is:

1. In an exposure replicate system wherein an object is mounted on an object station on a two-dimensionally movable stage and a mask containing a predetermined pattern to be placed on the object by exposure printing is held opposite to the object at a predetermined distance therefrom by mask holding means, the method of feeding the mask to the mask holding means comprising the steps of:
   (a) positioning said stage at a first moving position where said object station is opposed to said mask holding means;
   (b) mounting said mask on a mask station arranged on said stage at a different position from said object station;
   (c) moving said stage, along with said mask station and said object station, from said first moving position to a second moving position where said mask is opposed to said mask holding means;
   (d) displacing said mask station so as to make a prealignment of said mask with respect to said system; and
   (e) transferring said prealigned mask from said mask station onto said mask holding means.

2. A method according to claim 1, further comprising the step of displacing said mask holding means so as to make a fine alignment of said mask transferred onto said mask holding means with respect to said system.

3. A method according to claim 1, wherein said step (c) comprises the steps of displacing said stage for making a prealignment involving planar linear displacements of said mask, and displacing said mask station with respect to said stage for making another prealignment involving planar rotary movements and a vertical displacement of said mask.

4. A method according to claim 1, wherein said step (c) comprises the steps of detecting the deviation of fiducial mark means formed on said mask with respect to positional reference means preliminarily formed in said system, and aligning said fiducial mark means of said mask with said positional reference means in accordance with said detected deviation.

5. A method according to claim 4, further comprising the step of making a fine alignment of said mask transferred onto said mask holding means with respect to said system in accordance with said positional reference means and said fiducial mark means of said mask.

6. In an exposure replicate system wherein a two-dimensionally movable stage is provided for carrying an object and a mask containing a predetermined pattern to be placed on the object by exposure printing is held opposite to the object at a predetermined distance therefrom by mask holding means, the method of feeding the mask to the mask holding means comprising the steps of:
   (a) positioning said stage at a first moving position where a mask station arranged on said stage is deviated from said mask holding means at a direction of the movement of said stage;
   (b) mounting said mask on a mask station;
   (c) moving said stage, along with said mask station, from said first moving position to a second moving position where said mask is opposed to said mask holding means;
   (d) displacing said mask station so as take a prealignment of said mask with respect to said system; and
   (e) transferring said prealigned mask from said mask station onto said mask holding means.

7. In an exposure replicate system wherein an object mounted on first station means on a two-dimensionally movable stage and a mask containing a predetermined pattern to be placed on the object by exposure printing is held opposite to the object at a predetermined distance therefrom by mask holding means, a mask feed apparatus for feeding the mask to the mask holding means comprising:
   (a) second station means supporting said mask and movable along with said stage as a unit, said first and second station means being arranged on said stage at positions different from each other;
   (b) actuating means for moving said stage between a first moving position, where said first station means is opposed to said mask holding means, and a second moving position, where said second station means is opposed to said mask holding means;
   (c) detecting means having predetermined positional reference means, for detecting positional deviation of said mask on said second station means with respect to said positional reference means when said stage is moved into said second moving position;
   (d) control means responsive to said positional deviations detected by said detecting means to displace said second station means and thereby align said mask with said positional reference means; and
   (e) means for transferring said mask aligned with said positional reference means onto said mask holding means.

8. An apparatus according to claim 7, wherein said detecting means detects deviations of said mask held on said mask holding means, and wherein said system further comprises another control means for displacing said mask holding means in accordance with said deviations detected by said detecting means so as to align said mask held on said mask holding means with said positional reference means.

* * * * *